United States Patent
Wike et al.

(10) Patent No.: US 12,283,923 B2
(45) Date of Patent: Apr. 22, 2025

(54) SYSTEMS AND METHODS FOR CONTROLLING A POWER AMPLIFIER OUTPUT

(71) Applicant: Empower RF Systems, Inc., Inglewood, CA (US)

(72) Inventors: Donald M. Wike, Corona, CA (US); Steve Stevenson, Inglewood, CA (US); Paulo Correa, Dana Point, CA (US)

(73) Assignee: Empower RF Systems, Inc., Inglewood, CA (US)

( * ) Notice: Subject to any disclaimer, the term of this patent is extended or adjusted under 35 U.S.C. 154(b) by 423 days.

(21) Appl. No.: 17/589,576

(22) Filed: Jan. 31, 2022

(65) Prior Publication Data

US 2022/0158595 A1    May 19, 2022

Related U.S. Application Data

(63) Continuation of application No. 15/931,130, filed on May 13, 2020, now Pat. No. 11,239,804.

(Continued)

(51) Int. Cl.
*H03F 1/26* (2006.01)
*H03F 3/20* (2006.01)
(Continued)

(52) U.S. Cl.
CPC ............. *H03F 3/20* (2013.01); *H03G 3/3042* (2013.01); *H03F 1/3247* (2013.01);
(Continued)

(58) Field of Classification Search
CPC .... H03F 3/20; H03F 1/3247; H03F 2200/129; H03F 2200/451; H03F 2200/195;
(Continued)

(56) References Cited

U.S. PATENT DOCUMENTS 5,768,694 A * 6/1998 Kumagai ............. H03G 3/3042
455/69
6,496,062 B1 12/2002 Nitz et al.
(Continued)

OTHER PUBLICATIONS

Yeom, Hojun, "Autogenic EMG-Controlled Functional Electrical Stimulation for Ankle Dorsiflexion Control," J Neurosci Methods, Oct. 30, 2010, 17 pages.

(Continued)

*Primary Examiner* — Khanh V Nguyen
(74) *Attorney, Agent, or Firm* — Wilmer Cutler Pickering Hale and Dorr LLP

(57) ABSTRACT

Techniques for controlling the output of a power amplifier are disclosed. In one embodiment, the techniques may be realized as a system that includes a power amplifier and a controller coupled to the power amplifier to form a feedback loop. The power amplifier is enabled or disabled in response to a blanking signal. The controller includes an accumulator that stores an accumulated error of the feedback loop. The controller suspends operation of the accumulator when (1) a level of the input signal is below a first threshold for an amount of time that exceeds a second threshold, (2) the blanking signal indicates that the power amplifier is disabled, or (3) both. The controller resumes operation of the accumulator when (1) the level of the input signal is above the first threshold and (2) the blanking signal indicates that the power amplifier is enabled.

20 Claims, 3 Drawing Sheets

Related U.S. Application Data

(60) Provisional application No. 62/847,725, filed on May 14, 2019.

(51) Int. Cl.
*H03G 3/30* (2006.01)
*H03F 1/32* (2006.01)

(52) U.S. Cl.
CPC .. *H03F 2200/129* (2013.01); *H03F 2200/451* (2013.01); *H03G 2201/103* (2013.01); *H03G 2201/307* (2013.01)

(58) Field of Classification Search
CPC ......... H03F 2200/207; H03F 2200/211; H03F 2200/411; H03F 3/19; H03F 3/245; H03G 3/3042; H03G 2201/103; H03G 2201/307
See application file for complete search history.

(56) References Cited

U.S. PATENT DOCUMENTS

| | | | |
|---|---|---|---|
| 6,677,823 B2* | 1/2004 | Terosky | H03G 3/3042 |
| | | | 330/136 |
| 6,856,196 B2 | 2/2005 | Okubo et al. | |
| 6,859,099 B2* | 2/2005 | Akaiwa | H03F 1/3247 |
| | | | 330/136 |
| 7,317,353 B2 | 1/2008 | Hayase | |
| 7,514,996 B2 | 4/2009 | Furuta et al. | |
| 7,683,713 B2 | 3/2010 | Hongo | |
| 7,768,346 B1* | 8/2010 | Terrovitis | H03G 3/3042 |
| | | | 330/136 |
| 7,973,601 B2 | 7/2011 | Hamano | |
| 8,774,737 B2 | 7/2014 | Mori et al. | |

OTHER PUBLICATIONS

Di Caro, Domenico, "NMR measurements for hazelnuts classification," Department of Industrial Engineering at University of Salerno, May 8, 2018, 108 pages.

\* cited by examiner

SYSTEMS AND METHODS FOR CONTROLLING A POWER AMPLIFIER OUTPUT

RELATED APPLICATIONS

This application is a continuation of U.S. patent application Ser. No. 15/931,130, entitled "Systems and methods for controlling a power amplifier output," filed May 13, 2020, which claims priority under 35 U.S.C. § 119(e) to U.S. Provisional Patent Application No. 62/847,725, entitled "Systems and methods for controlling a power amplifier output," filed May 14, 2019, each of which is incorporated by reference herein in its entirety.

FIELD OF THE DISCLOSURE

The present disclosure generally relates to power amplifiers and, more particularly, to techniques for controlling the output of a power amplifier.

BACKGROUND OF THE DISCLOSURE

Power amplifiers may be used in a wide variety of applications, from communications to electronic warfare systems. Often, it is desirable to keep the output of the power amplifier (e.g., the output power level, the gain, etc.) constant or nearly constant during operations. It can also be desirable to mute the power amplifier (e.g., temporarily disable the power amplifier) at certain times. However, controlling the output of a power amplifier can be challenging. For example, many power amplifiers have a frequency response that can vary by several decibels (dB) (e.g., +/−4 dB) over the relevant frequency range.

Thus, it may be understood that there may be a need for techniques for controlling the output of a power amplifier that improve upon traditional techniques.

BRIEF DESCRIPTION OF THE DRAWINGS

To facilitate a fuller understanding of the present disclosure, reference is now made to the accompanying drawings, in which like elements are referenced with like numerals. These drawings should not be construed as limiting the present disclosure, but are intended to be illustrative only.

DETAILED DESCRIPTION

Figure 1:
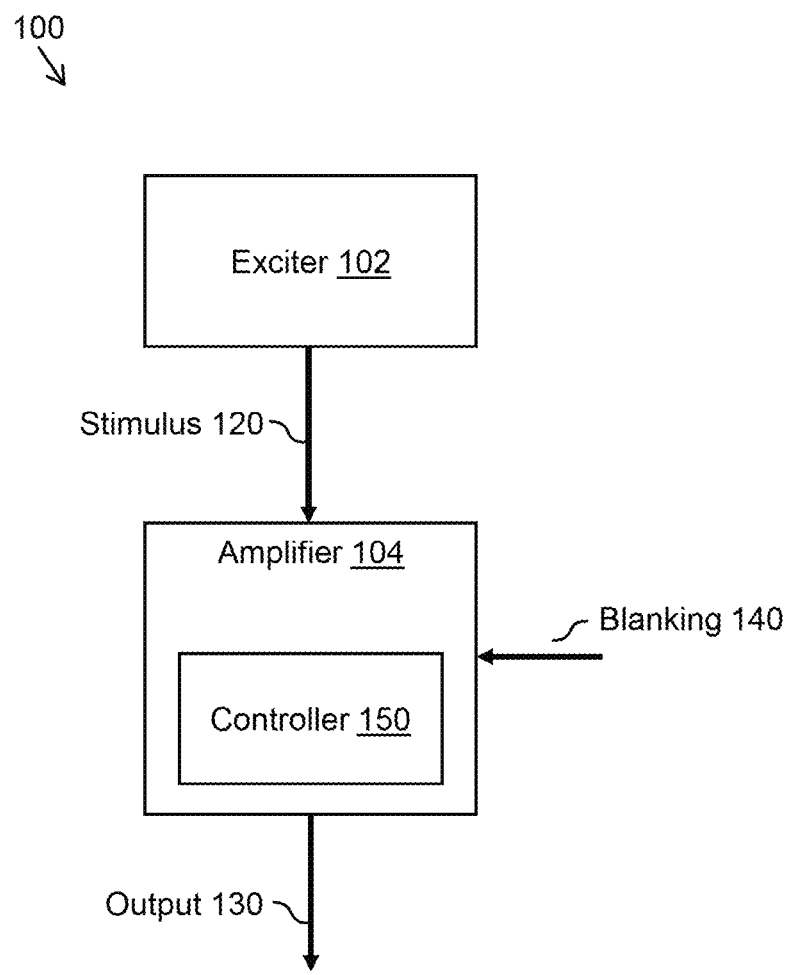
FIG. 1 is a simplified diagram of a system for generating an amplified signal according to some embodiments.

FIG. 1 is a simplified diagram of a system 100 for generating an amplified signal according to some embodiments. System 100 includes an exciter 102 coupled to an amplifier 104. Exciter 102 generates, and amplifier 104 receives, a stimulus signal 120. Based on stimulus signal 120, amplifier 104 generates an output signal 130, which generally corresponds to an amplified version of stimulus signal 120. In general, stimulus signal 120 and output signal 130 may correspond to broadband and/or radio frequency (RF) signals.

In various applications, such as communications or electronic warfare systems, it is desirable to blank (or mute) output signal 130 at various times. For example, it may be desirable to blank output signal 130 at a duty cycle in a range of 10% to 90% to provide opportunities for system 100 to listen to other signals (e.g., other RF signals) in the environment. Accordingly, amplifier 104 may receive a blanking signal 140 that indicates when output signal 130 should be muted. In response to blanking signal 140, amplifier 104 may be disabled.

In some embodiments, exciter 102 may be a frequency hopping exciter. Consistent with such embodiments, a stimulus frequency of stimulus signal 120 at a given point in time may be randomly selected from a plurality of hopping frequencies. The stimulus frequency can randomly hop among the plurality of hopping frequencies at predetermined time intervals. In some embodiments, frequency hopping may occur rapidly relative to the time scale at which output signal 130 is muted and unmuted by blanking signal 140. For example, the frequency of stimulus signal 120 may undergo multiple hops during each interval in which output signal 130 is unmuted.

In general, amplifier 104 amplifies stimulus signal 120 according to a frequency response of amplifier 104. When the stimulus frequency of stimulus signal 120 varies (e.g., during frequency hopping operation), the gain and/or output power of amplifier 104 may also vary. For example, broadband amplifiers used in RF systems can have frequency responses that vary up to +/−4 decibels (dB) over the range of frequencies used for frequency hopping.

In order to maintain the output power of amplifier 104 as the stimulus frequency changes, system 100 may include various compensation mechanisms. One possible compensation mechanism is for exciter 102 to tune the level of stimulus signal 120 to account for the frequency response of amplifier 104. For example, in frequency hopping applications, a different level of stimulus signal 120 may be generated for each of the plurality of hopping frequencies. However, this approach may involve significant efforts to calibrate stimulus signal 120 for each of the plurality of hopping frequencies, and even after calibration may provide low accuracy.

To address these challenges, amplifier 104 may include controller 150 that forms a feedback loop that automatically controls the gain and/or output power of amplifier 104. For example, the feedback loop may include an automatic gain control (AGC) feedback loop or an automatic power control feedback loop. In this manner, a constant level of output signal 130 may be achieved even as the stimulus frequency and/or level of stimulus signal 120 undergo changes. For example, the feedback loop may be configured as a proportional-integral-derivative (PID) control loop.

The feedback loop may be associated with a transient response to changes in stimulus signal 120 and/or blanking signal 140. In general, it is desirable to control the transient response to prevent or mitigate overshoot and undershoot, which can cause faults, loss of application, damage to amplifier 104, or the like. However, controlling the transient response may be challenging when responding to changes that occur at different time scales. For example, during frequency hopping operation, the stimulus frequency of stimulus signal 120 may change at a fast time scale, whereas muting and unmuting via blanking signal 140 may occur at a slow time scale. Accordingly, while it may be desirable for the feedback loop to respond slowly to prevent overshoot during muting and unmuting, a slow response of feedback loop may be incompatible with rapid frequency hopping operation.

Thus, there is a need for techniques to control the gain and/or output of amplifier 104 that address both changes in the stimulus frequency of stimulus signal 120 and muting and unmuting of amplifier 104 via blanking signal 140.

Figure 2:
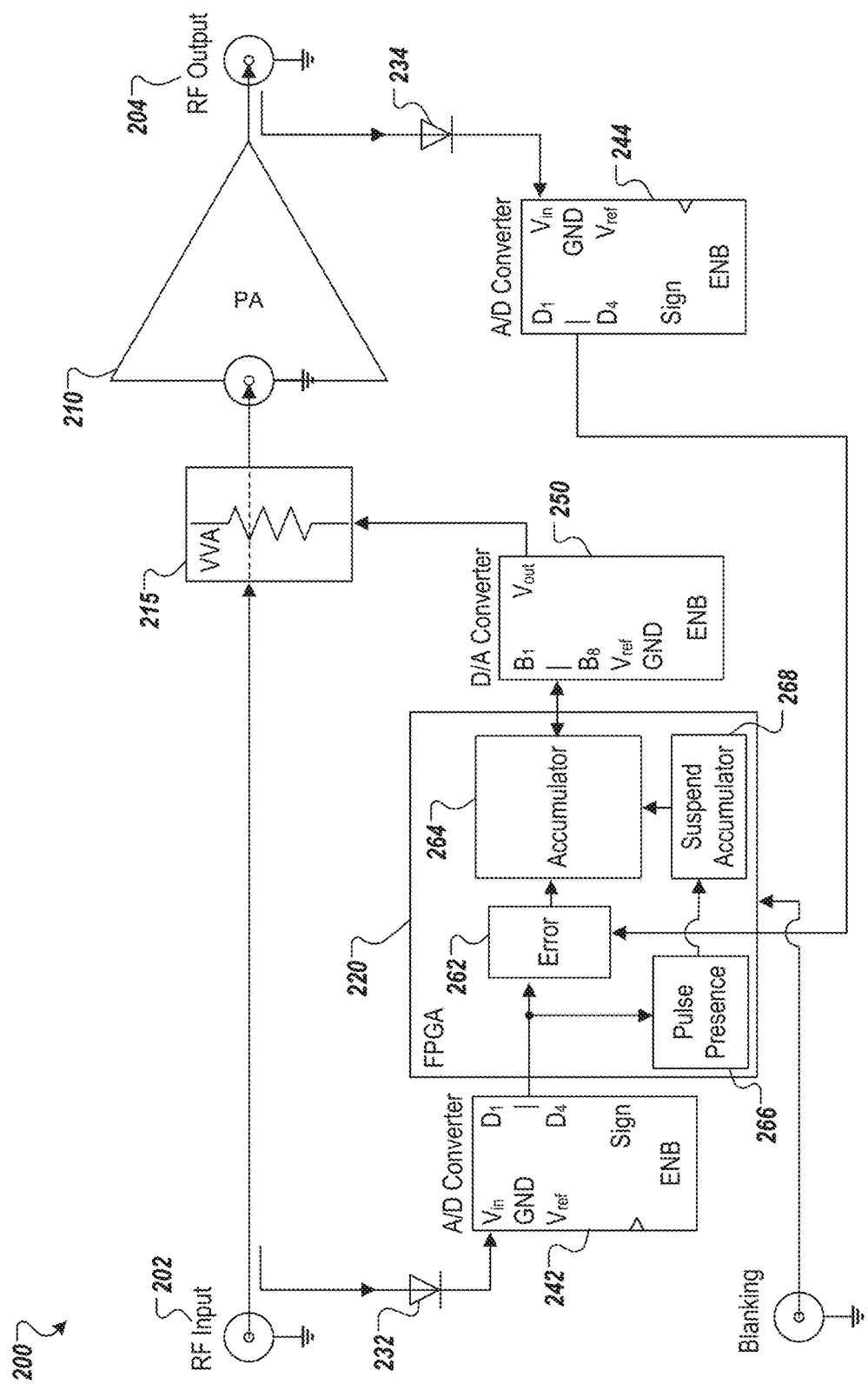
FIG. 2 is a simplified diagram of an amplifier system according to some embodiments.

FIG. 2 is a simplified diagram of an amplifier system 200 according to some embodiments. In some embodiments, amplifier system 200 may generally correspond to amplifier 104 and may address the above-identified challenges associated with controlling the gain and/or output of amplifier 104.

Amplifier system 200 includes an input node 202, an output node 204, and a blanking node 206. Input node 202 receives an input signal to amplifier system 200, such as stimulus signal 120. Output node 204 provides an output signal of amplifier system 200, such as output signal 130. Blanking node 206 receives a blanking signal, such as blanking signal 140.

Amplifier system 200 further includes a power amplifier 210 coupled between input node 202 and output node 204. When enabled, power amplifier 210 amplifies the input signal according to a frequency response of power amplifier 210. Power amplifier 210 can be disabled in response to the blanking signal.

A voltage variable attenuator (VVA) 215 is arranged in series at the input of power amplifier 210 and is used to control the gain and/or output power of amplifier system 200. For example, when the gain or output power of amplifier system 200 exceeds a predetermined setpoint, a control signal may be provided to VVA 215 to reduce the level of the stimulus signal at the input of power amplifier 210. The use of VVA 215 is illustrative, and it is to be understood that any number of techniques may be used to control the gain and/or output power of amplifier system 200 responsive to a control signal.

Amplifier system 200 further includes a controller 220, which may generally correspond to controller 150. Controller 220 is coupled to power amplifier 210 to form a feedback loop that controls the gain and/or output power of power amplifier 210 (as used herein, the gain of power amplifier 210 refers to the gain of power amplifier 210 in series with VVA 215). In some embodiments, controller 220 may include one or more processors and may be implemented using software, hardware, or a combination thereof. As illustrated in FIG. 2, controller 220 can also be implemented using an FPGA. Controller 220 receives measurements of the levels of the input signal and the output signal from an input detector 232 and an output detector 234, respectively. In some embodiments, the measurements are converted to a digital format using analog-to-digital (A/D) converters 242 and 244, respectively. In some embodiments, the measurements may correspond to root mean square (RMS) voltage measurements of the input and output signals. Alternative measurements, such as peak detection measurements, may be used, but the decay of the peak detection may slow down the update capacity of the feedback loop. Controller 220 outputs a control signal to VVA 215, which is converted to an analog voltage signal using digital-to-analog (D/A) converter 250.

Controller 220 can include a plurality of modules 262-268. As used herein, the term "module" may be understood to refer to computing software, firmware, hardware, and/or various combinations thereof. It is noted that the modules are exemplary. The modules may be combined, integrated, separated, and/or duplicated to support various applications. Also, a function described herein as being performed at a particular module may be performed at one or more other modules and/or by one or more other devices instead of or in addition to the function performed at the particular module. Further, the modules may be implemented across multiple devices and/or other components local or remote to one another. Additionally, the modules may be moved from one device and added to another device, and/or may be included in both devices.

An error module 262 can detect an error between a measured parameter and a target setpoint. For example, the measured parameter may correspond to the gain of power amplifier 210, the output power of power amplifier 210, or the like. The error may be calculated as a difference between the measured parameter and the target setpoint. In some embodiments, the output of error module 262 may correspond to the error value of the feedback loop.

An accumulator module 264 can calculate and store an accumulated error of the feedback loop. For example, when the feedback loop is configured as a PID control loop, the accumulated error may be used to determine the integral term of the PID control loop.

In some embodiments, overshoot or undershoot may occur when the accumulated error of accumulator module 264 continues to accumulate after a large and/or rapid change in the input signal. For example, in frequency hopping operation, a frequency hopping exciter (e.g., exciter 102) may turn off the output stimulus signal (e.g., stimulus signal 120) for a short time interval when hopping between frequencies, causing the level of the stimulus signal (e.g., the envelope of the stimulus signal) to briefly drop close to zero between hops. During the time interval when the stimulus signal is turned off, the default behavior of controller 220 may be to clear the accumulated error of accumulator module 264. However, when the stimulus signal turns on again, the fact that the accumulated error is cleared may result in undershoot or overshoot.

Accordingly, a pulse presence module 266 may detect changes in the input signal that are likely to cause overshoot or undershoot. For example, pulse presence module 266 may detect a condition that indicates that the stimulus signal is in the process of hopping between frequencies, e.g., the input signal dropping below a first threshold (e.g., close to zero) for an amount of time that exceeds a second threshold (e.g., 100 nanoseconds). In this regard, pulse presence module 266 may be configured as an envelope detector that detects the level of the input signal via input detector 232.

A suspend accumulator module 268 is coupled to pulse presence module 266. In response to receiving a signal from pulse presence module 266 indicating a change in the input signal that is likely to cause overshoot or undershoot (e.g., the input signal being turned off), suspend accumulator module 268 may suspend the operation of accumulator module 262. In this regard, suspend accumulator module 268 may override the default behavior of accumulator module 262 (e.g., suspend accumulator module 268 may prevent the accumulated error from being cleared). When the operation of accumulator module 262 is suspended, the last value of the accumulated error before operation was suspended may be stored. Then, when the input signal turns on again, accumulator module 268 is re-engaged and initialized with the stored value of the accumulated error. In some embodiments, the stored value may be reduced by a small amount (e.g., two bits, or the binary value "11") prior to re-engaging accumulator module 268.

The above-described techniques may prevent or reduce overshoot, undershoot, or other distortions to the output signal during frequency hopping operations and other high frequency changes to the input signal. However, overshoot or undershoot may still occur due to the lower frequency muting and unmuting of power amplifier 210 in response to the blanking signal. Accordingly, suspend accumulator module 268 may also be configured to suspend the operation of accumulator module 262 in response to the blanking signal indicating that power amplifier 210 is disabled or muted. Moreover, in a scenario where the operation of accumulator module 262 is already suspended, the blanking signal may prevent the accumulator module 262 from re-engaging, such that the accumulator module 262 waits to re-engage until the blanking signal indicates that power amplifier 210 has been re-enabled or unmuted. In this manner, controller 220 may address overshoot or undershoot arising from both high-frequency frequency hopping operations and low-frequency blanking operations.

Figure 3:
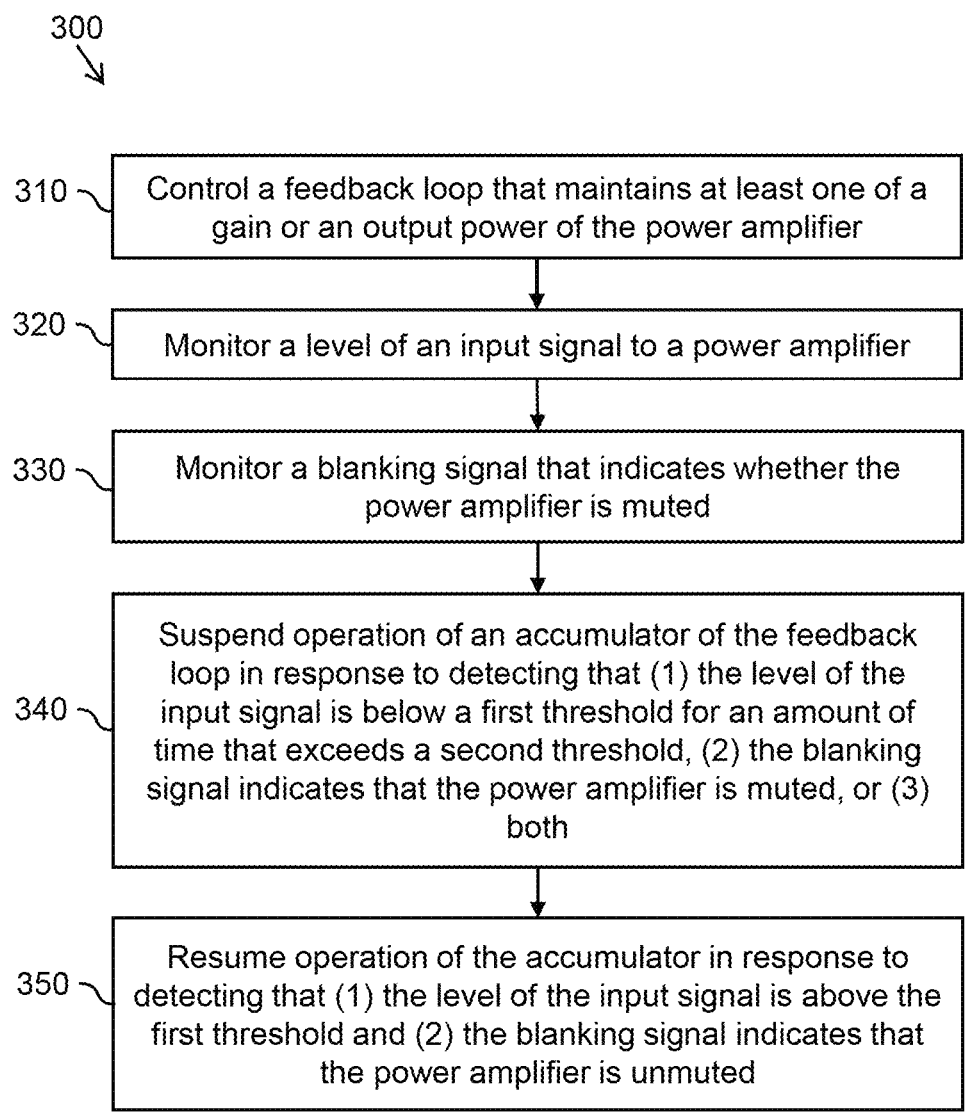
FIG. 3 is a simplified diagram of a method for controlling a power amplifier output according to some embodiments.

FIG. 3 is a simplified diagram of a method 300 for controlling a power amplifier output according to some embodiments. In some embodiments, method 300 may be implemented by controller 220 to prevent or mitigate overshoot or undershoot arising from frequency hopping operations and blanking operations.

At a process 310, a feedback loop that maintain or controls at least one of a gain or an output power of the power amplifier (e.g., power amplifier 210 in series with VVA 215) is controlled. The feedback loop may be controlled in an automatic gain control mode or an automatic power control mode. For example, for the embodiment of FIG. 2, process 310 can be implemented by controller 220.

At a process 320, a level of an input signal to a power amplifier is monitored. For example, the level of the input signal may be monitored using input detector 232. In some embodiments, the level of the input signal may correspond to an RMS voltage of the input signal.

At a process 330, a blanking signal that indicates whether the power amplifier is muted is monitored. In some embodiments, the blanking signal may include a DC voltage signal that goes to a high voltage level to mute the power amplifier and a low voltage level to unmute the power amplifier, or vice versa. For example, for the embodiment of FIG. 2, process 330 can be implemented by controller 220.

At a process 340, operation of an accumulator of the feedback loop is suspended in response to detecting that (1) the level of the input signal is below a first threshold for an amount of time that exceeds a second threshold, (2) the blanking signal indicates that the power amplifier is muted, or (3) both. For example, the determination that the level is below the first threshold for an amount of time that exceeds the second threshold may be made by pulse presence module 266, and the operation of the accumulator may be suspended by suspend accumulator module 268. In some embodiments, the blanking signal may indicate that the power amplifier is muted during time periods when an RF system (e.g., system 100) desires to listen to the RF environment. In some embodiments, suspending operation of the accumulator may include storing the last value of the accumulated error prior to suspending operation. For example, for the embodiment of FIG. 2, the last accumulator value may be stored by accumulator module 264, suspend accumulator module 268, or both. In some embodiments, the level of the input signal and the blanking signal may continue to be monitored (consistent with processes 320 and 330, respectively) during process 340.

At a process 350, operation of the accumulator is resumed in response to detecting that (1) the level of the input signal exceeds first threshold and (2) the blanking signal indicates that the power amplifier is unmuted. In some embodiments, when the operation of the accumulator is resumed, the accumulated error may be initialized to the stored accumulated error from before the operation of the accumulator was suspended. In some embodiments, the stored accumulated error may be reduced by a small amount (e.g., two bits) before being used to initialize the accumulator. In cases where the operation of the accumulator is suspended based on the level of the input signal decreasing below the first threshold at process 340 (case (1)), the operation of the accumulator may be resumed in response to the level of the input signal returning to a level above the first threshold. However, resuming operation of the accumulator while the power amplifier is muted may result in overshoot or undershoot when the power amplifier is later unmuted. Accordingly, consistent with process 350, the accumulator is kept suspended as long as the power amplifier is muted. For example, for the embodiment of FIG. 2, process 350 can be implemented by suspend accumulator module 268 of controller 220.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of at least one particular implementation in at least one particular environment for at least one particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A system comprising:
    a first electronic circuit that processes an input signal when enabled, the first electronic circuit being enabled or disabled in response to a control signal; and
    a second electronic circuit coupled to the first electronic circuit, the first electronic circuit and the second electronic circuit forming a feedback loop, the second electronic circuit obtaining a measured parameter associated with the first electronic circuit and maintaining an accumulated value associated with the measured parameter, wherein maintaining the accumulated value comprises compensating for a time period when the control signal indicates that the first electronic circuit is disabled.

2. The system of claim 1, wherein maintaining the accumulated value further comprises compensating for a second time period when a level of the input signal is below a first threshold, wherein the level of the input signal corresponds to at least one of a power level, a gain, or a voltage.

3. The system of claim 2, wherein compensating for the second time period comprises detecting that the input signal is below the first threshold for an amount of time that exceeds a second threshold.

4. The system of claim 2, wherein the second electronic circuit comprises an envelope detector to detect the level of the input signal.

5. The system of claim 2, wherein the level of the input signal corresponds to an RMS voltage of the input signal.

6. The system of claim 1, wherein the input signal corresponds to a frequency hopping input signal.

7. The system of claim 6, wherein the first electronic circuit is associated with a frequency response, and wherein the second electronic circuit adjusts at least one characteristic of the first electronic circuit throughout a frequency range of the frequency hopping input signal.

8. The system of claim 6, wherein a frequency of the frequency hopping input signal changes more rapidly than a rate at which the first electronic circuit is enabled or disabled in response to the control signal.

9. The system of claim 1, wherein the second electronic circuit comprises a proportional-integral-derivative (PID) control loop.

10. The system of claim 1, wherein the second electronic circuit comprises a voltage variable attenuator arranged in series at an input of the first electronic circuit.

11. The method of claim 1, wherein compensating for the time period when the control signal indicates that the first electronic circuit is disabled comprises storing a last value of the accumulated value prior to a start of the time period, and initializing the accumulated value based on the stored last value at an end of the time period.

12. A method comprising:
monitoring, by a first electronic feedback coupled to a second electronic circuit, a control signal that indicates whether the second electronic circuit is enabled or disabled, the first electronic circuit and the second electronic circuit form a feedback loop;
obtaining, by the first electronic circuit, a measured parameter associated with the second electronic circuit;
maintaining, by the first electronic circuit, an accumulated value associated with the measured parameter, wherein maintaining the accumulated value comprises compensating for a time period when the control signal indicates that the second electronic circuit is disabled.

13. The method of claim 12, wherein maintaining the accumulated value further comprises compensating for a second time period when a level of the input signal is below a first threshold, wherein the level of the input signal corresponds to at least one of a power level, a gain, or a voltage.

14. The method of claim 13, wherein compensating for the second time period comprises detecting that the input signal is below the first threshold for an amount of time that exceeds a second threshold.

15. The method of claim 12, wherein the input signal corresponds to a frequency hopping input signal.

16. The method of claim 15, further comprising adjusting, by the first electronic circuit, at least one characteristic of the second electronic circuit throughout a frequency range of the frequency hopping input signal.

17. The method of claim 15, wherein a frequency of the frequency hopping input signal changes more rapidly than a rate at which the second electronic circuit is enabled or disabled in response to the control signal.

18. The method of claim 12, wherein compensating for the time period when the control signal indicates that the second electronic circuit is disabled comprises storing a last value of the accumulated value prior to a start of the time period, and initializing the accumulated value based on the stored last value at an end of the time period.

19. A non-transitory computer-readable medium storing instructions that, when executed by one or more hardware processors, cause the one or more hardware processors to perform operations comprising:
monitoring a control signal that indicates whether an electronic circuit is enabled or disabled;
obtaining a measured parameter associated with the electronic circuit; and
maintaining an accumulated value associated with the measured parameter, wherein maintaining the accumulated value comprises compensating for a time period when the control signal indicates that the electronic circuit is disabled.

20. The non-transitory computer-readable medium of claim 19, wherein compensating for the time period when the control signal indicates that the electronic circuit is disabled comprises storing a last value of the accumulated value prior to a start of the time period, and initializing the accumulated value based on the stored last value at an end of the time period.

* * * * *